(12) United States Patent
Rountree

(10) Patent No.: US 8,525,581 B2
(45) Date of Patent: Sep. 3, 2013

(54) POWER SUPPLY PROTECTION CIRCUIT AND METHOD

(76) Inventor: Robert Newton Rountree, Richardson, TX (US)

( * ) Notice: Subject to any disclaimer, the term of this patent is extended or adjusted under 35 U.S.C. 154(b) by 0 days.

(21) Appl. No.: 13/609,005

(22) Filed: Sep. 10, 2012

(65) Prior Publication Data

US 2013/0120056 A1 May 16, 2013

Related U.S. Application Data

(60) Provisional application No. 61/629,231, filed on Nov. 14, 2011.

(51) Int. Cl.
*G05F 1/10* (2006.01)
*G05F 3/02* (2006.01)

(52) U.S. Cl.
USPC .......................................... 327/541; 327/530

(58) Field of Classification Search
USPC .................. 327/545, 536, 530, 538, 540, 541
See application file for complete search history.

(56) References Cited

U.S. PATENT DOCUMENTS

| 7,567,118 | B2 * | 7/2009 | Azuma et al. | 327/536 |
|---|---|---|---|---|
| 7,706,204 | B2 * | 4/2010 | Choi et al. | 365/226 |
| 2004/0061549 | A1 * | 4/2004 | Imamiya | 327/536 |
| 2005/0169021 | A1 * | 8/2005 | Itoh | 363/60 |
| 2007/0200612 | A1 * | 8/2007 | Jung | 327/407 |
| 2009/0267683 | A1 * | 10/2009 | Lee et al. | 327/538 |
| 2010/0109723 | A1 * | 5/2010 | Shin | 327/143 |

* cited by examiner

*Primary Examiner* — Quan Tra

(57) ABSTRACT

A method of protecting a power supply voltage in an integrated circuit is disclosed. The method includes storing charge in a charge reservoir capacitor (142), receiving a power supply sample voltage (140), and receiving a load power supply voltage (VDDL, 102). The power supply sample voltage is compared to the load power supply voltage (150). Charge is added from the charge reservoir capacitor (142) to the load power supply (VDDL) through transistor 126 and capacitor 144 in response to the step of comparing.

19 Claims, 2 Drawing Sheets

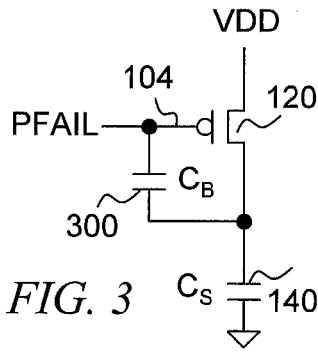
FIG. 3
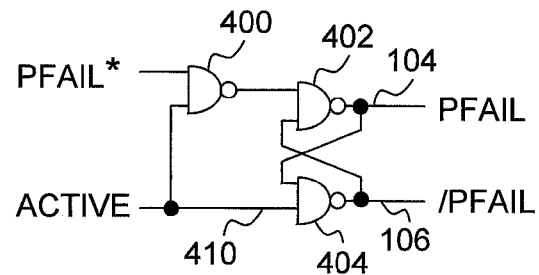
FIG. 4
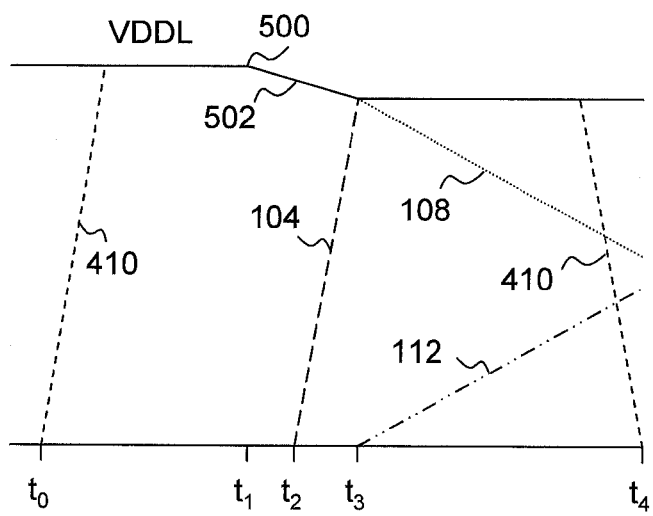
FIG. 5
| $C_R/C_L$ | $C_P/C_R$ | dV |
|---|---|---|
| 0.1 | 10.5 | 0.268 |
| 0.2 | 5.5 | 0.286 |
| 0.3 | 3.8 | 0.301 |
| 0.4 | 3.0 | 0.318 |
| 0.5 | 2.5 | 0.333 |
| 0.6 | 2.1 | 0.343 |
| 0.7 | 1.9 | 0.359 |
| 0.8 | 1.7 | 0.371 |
| 0.9 | 1.5 | 0.376 |
| 1.0 | 1.4 | 0.389 |
| 1.1 | 1.3 | 0.399 |
| 1.2 | 1.2 | 0.406 |
| 1.3 | 1.2 | 0.425 |
| 1.4 | 1.1 | 0.428 |
| 1.5 | 1.1 | 0.445 |
| 1.6 | 1.0 | 0.444 |
| 1.7 | 1.0 | 0.460 |
| 1.8 | 0.9 | 0.456 |
| 1.9 | 0.9 | 0.469 |
| 2.0 | 0.9 | 0.482 |
FIG. 6

POWER SUPPLY PROTECTION CIRCUIT AND METHOD

This application claims the benefit under 35 U.S.C. §119 (e) of Provisional Appl. No. 61/629,231, filed Nov. 14, 2011, which is incorporated herein by reference in its entirety.

BACKGROUND OF THE INVENTION

Embodiments of the present embodiments relate to a power supply protection circuit to temporarily maintain a functional power supply level for an integrated circuit in the event of power failure.

Power failure in integrated circuits may occur for a variety of reasons including external power failure, faulty battery contacts, sudden shock to portable devices such as dropping a cell phone, or circuit failure due to hardware or software problems. Power failure is often harmless, and integrated circuits are typically designed to provide an orderly shut down when a power failure is detected. This, however, may require large decoupling capacitors to maintain a functional power supply level and may be inadequate in the event of critical circuit operations. For example, if a power failure occurs during a write operation in a nonvolatile memory, data may be lost. Likewise, if a power failure occurs during transmission of a data frame, data may be lost. If a power failure occurs during a transfer of control in a processor circuit, a jump or subroutine call instruction may produce an incorrect address in an instruction pointer, thereby causing the processor circuit to "hang up." Alternatively, if a power failure occurs during a disk write operation, incorrect data may be written to the disk resulting in a corrupt data file. Unexpected power failure in electronic devices, therefore, tends to cause temporary or permanent data loss in a wide variety of electronic devices.

BRIEF SUMMARY OF THE INVENTION

In a preferred embodiment of the present invention, a method of protecting a power supply voltage is disclosed. The method includes storing charge in a charge reservoir capacitor, receiving a power supply sample voltage, and receiving a load power supply voltage. The power supply sample voltage is compared to the load power supply voltage, and charge is added from the charge reservoir capacitor to the load power supply in response to the step of comparing. The present invention maintains a substantially constant load power supply voltage in the event of a power failure during a memory access cycle, a transmit cycle, or other critical operation where data may otherwise be lost.

BRIEF DESCRIPTION OF THE SEVERAL VIEWS OF THE DRAWING

FIG. 3 is an alternative embodiment of the circuit diagram of FIG. 2;

FIG. 4 is a schematic diagram showing a latch circuit for producing a power fail signal;

FIG. 5 is a timing diagram illustrating operation of the circuit of FIG. 2; and

FIG. 6 is a table of normalized values for $C_P$ and $C_R$ in relation to $C_L$.

DETAILED DESCRIPTION OF THE INVENTION

The preferred embodiments of the present invention provide significant advantages of power supply protection over integrated circuits of the prior art as will become evident from the following detailed description.

Figure 1:
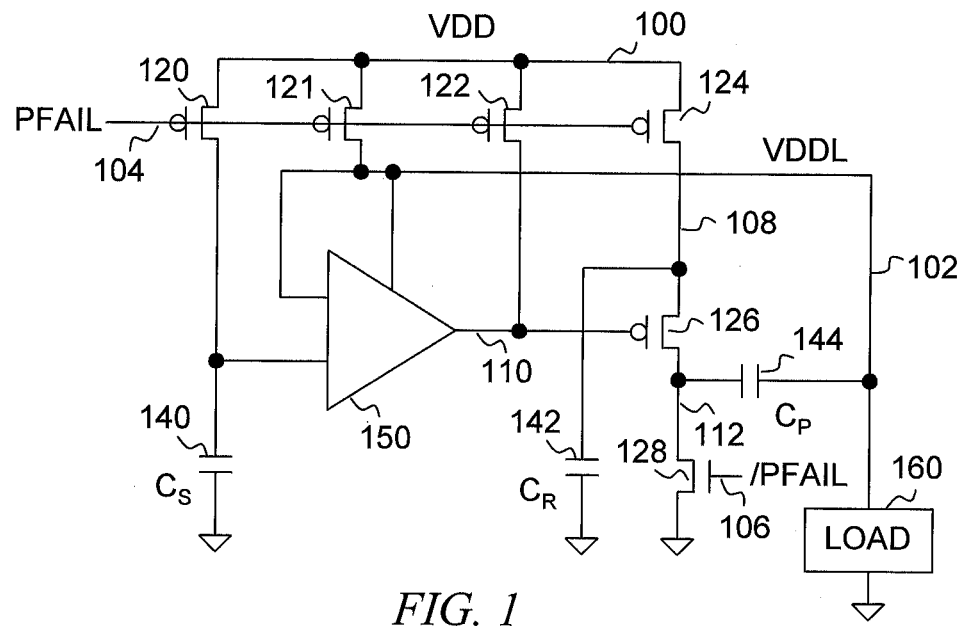
FIG. 1 is a simplified schematic diagram of a power supply protection circuit of the present invention.

Referring to FIG. 1, there is a simplified schematic diagram of a power supply protection circuit of the present invention. Here and in the following discussion the same reference numerals of various figures refer to the same elements. The circuit includes capacitor $C_S$ 140 arranged to store a power supply sample voltage, a charge reservoir capacitor $C_R$ 142, and a pump capacitor $C_P$ 144. Comparator 150 has one input terminal coupled to capacitor $C_S$ and a second input terminal coupled to capacitor $C_P$. The output terminal of comparator 150 is coupled to a control terminal of p-channel transistor 126. P-channel transistor 126 has a current path coupled between capacitor $C_R$ and capacitor $C_P$. Capacitor $C_P$ is coupled to load power supply VDDL terminal 102. The load power supply VDDL provides a power supply voltage to load circuit 160. N-channel transistor 128 is coupled to receive complementary power fail signal/PFAIL on lead 106. The circuit also includes p-channel transistors 120-124 having control terminals coupled to receive power fail signal PFAIL on lead 104. Each of p-channel transistors 120-124 has a respective current path to couple power supply voltage VDD terminal 100 to respective circuit elements as will be discussed in detail. Each of p-channel transistors 120-124 also has an n-well bulk terminal (not shown) coupled to the respective current path terminal opposite power supply VDD terminal 100. This prevents forward biasing parasitic PNP transistors if power supply voltage VDDL becomes more positive than power supply voltage VDD. During power up, therefore, the ramp rate of power supply voltage VDD should be regulated to prevent a voltage across any of p-channel transistors 120-124 from exceeding a diode drop.

In normal operation, power fail signal PFAIL remains low and complementary power fail signal/PFAIL remains high. In this state, p-channel transistors 120-124 and n-channel transistor 128 are on. P-channel transistor 120 charges capacitor $C_S$ 140 to power supply voltage VDD. P-channel transistor 121 applies power supply voltage VDD to load power supply VDDL terminal 102 and to comparator 150. P-channel transistor 122 applies power supply voltage VDD to the control terminal of p-channel transistor 126, so that it remains off in normal operation. P-channel transistor 124 charges capacitor $C_R$ 142 to power supply voltage VDD. N-channel transistor 128 connects terminal 112 to ground or reference supply terminal VSS as indicated by the small triangle to charge capacitor $C_P$ to power supply voltage VDD or load power supply voltage VDDL.

Figure 2:
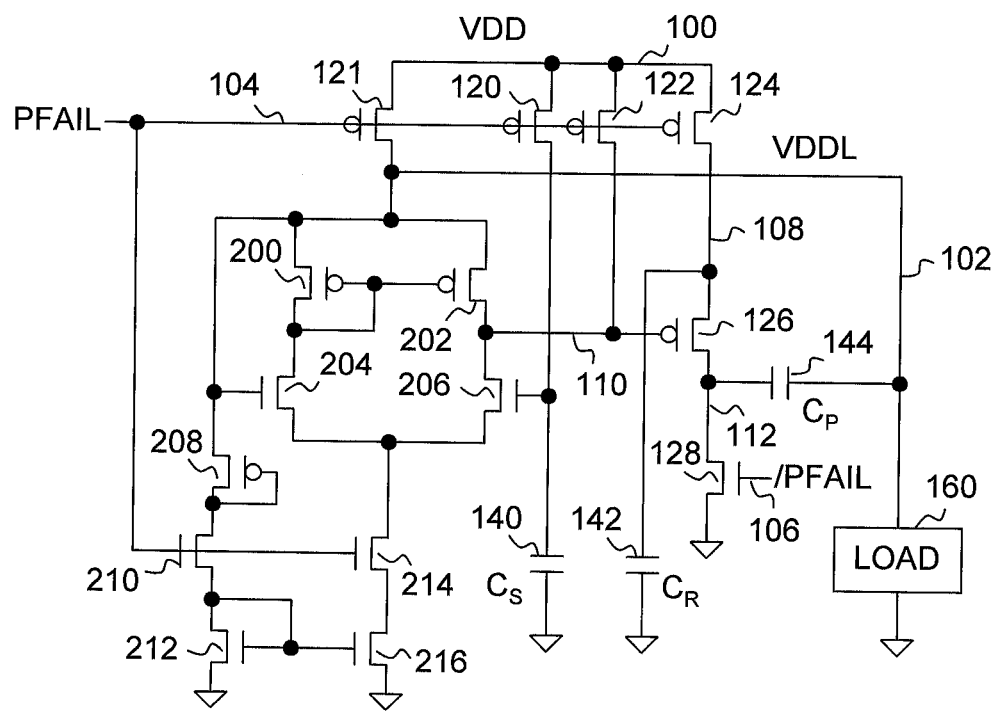
FIG. 2 is a more detailed schematic diagram of the power supply protection circuit of FIG. 1.

Referring now to FIG. 2, there is a more detailed schematic diagram of the power supply protection circuit of FIG. 1. In this embodiment, comparator circuit 150 includes p-channel transistors 200-202 and n-channel transistors 204-206 and 216. P-channel transistor 208 and n-channel transistor 212 produce a reference voltage at the control gate of n-channel transistor 216. In normal operation, however, power fail signal PFAIL remains low so that n-channel transistors 210 and 214 remain off. This disables both the reference circuit (208, 212) and the comparator circuit (202-206 and 216) so that no power is consumed by either circuit during normal operation.

Referring next to FIG. 4, there is a latch circuit that may be used to produce power fail signal PFAIL and complementary power fail signal/PFAIL. NAND gate 400 is coupled to receive power fail signal PFAIL* and control signal ACTIVE. Power fail signal PFAIL* is typically produced by a memory controller or other control circuit powered by VDD. Alternatively, power fail signal PFAIL* may be generated by a comparator circuit which compares power supply voltage VDD to a predetermined threshold. During normal operation, therefore, power fail signal PFAIL* remains low. Control signal ACTIVE goes high to indicate a critical operation is in progress. This may be an active memory cycle, a transmit signal, a transfer of control operation in a processor circuit, a disk write operation, or any other operation that should be completed before a complete power loss occurs. NAND gates 400-404 are preferably powered by load power supply voltage VDDL and latch the state of the power fail signal PFAIL*.

In normal operation, power fail signal PFAIL* remains low, so the output on NAND gate 400 is high. When control signal ACTIVE is low, complementary power fail signal/PFAIL at the output of NAND gate 404 is high. The high levels of both input signals at the input terminals of NAND gate 402 produces a low level of power fail signal PFAIL at lead 104. When control signal ACTIVE at lead 410 goes high, there is no change in the state of the latch circuit, since the low level of power fail signal PFAIL at lead 104 disables NAND gate 404.

Turning now to FIG. 5, operation of the power supply protection circuit of FIG. 2 and the latch circuit of FIG. 4 will be explained in detail. During normal operation, control signal ACTIVE at lead 410 goes high at time $t_0$, thereby indicating the start of a critical circuit operation. At time $t_1$ a failure of power supply VDD and load power supply VDDL begins 500. The power supply failure is detected at time $t_2$ 502, and power fail signal PFAIL* goes high. The high level of PFAIL* and control signal ACTIVE produce a low level output from NAND gate 400. The low level from NAND gate 400 produces a high level output from NAND gate 402 of power fail signal PFAIL at lead 104. The high level of power control signal PFAIL at lead 104 together with the high level of control signal ACTIVE at lead 410 produce a low level output of complementary power fail signal/PFAIL at lead 106. The latch circuit remains in this state while control signal ACTIVE remains high without regard to the state of power fail signal PFAIL*.

Returning now to FIGS. 2 and 4, the low level of complementary power fail signal/PFAIL turns off n-channel transistor 128 so that terminal 112 of capacitor $C_P$ is no longer connected to reference voltage VSS or ground. The high level of power fail signal PFAIL at lead 104 performs several operations. First, it turns on n-channel transistors 210 and 214. This produces a reference voltage at the control gate of n-channel transistor 216 and enables comparator circuit 150 (200-206, 216). At the same time, the high level of power fail signal PFAIL turns off p-channel transistors 120-124 and produces several results. First, the off state of P-channel transistor 120 stores a power supply sample voltage VDDL on capacitor $C_S$. Thus, the control gate of n-channel transistor 206 remains at VDDL. Second, the off state of p-channel transistor 121 isolates power supply voltage VDD at lead 100 from load power supply voltage VDDL at lead 102. Third, the off state of p-channel transistor 122 isolates power supply voltage VDD at lead 100 from the control gate of p-channel transistor 126, so the conductivity of p-channel transistor 126 is determined by the output of comparator circuit 150 at lead 110. Finally, the off state of p-channel transistor 124 isolates power supply voltage VDD at lead 100 from capacitor $C_R$ 142. In this state, if power supply voltage VDDL at the control gate of n-channel transistor 204 falls below the power supply sample voltage on capacitor $C_S$ 140, the output voltage of comparator 150 at lead 110 goes lower. This lower output voltage makes p-channel transistor 126 more conductive. As a result, the voltage at lead 108 decreases as the voltage at lead 112 increases at time $t_3$ (FIG. 5). The increasing voltage at lead 112 pumps current through capacitor $C_P$ 144 to restore load power supply voltage VDDL on lead 102 to substantially the same voltage as the power supply sample voltage on capacitor $C_S$ 140. In other words, the current through capacitor $C_P$ 144 is substantially the same as the current consumed by load circuit 160. Thus, load power supply voltage VDDL remains substantially constant. Finally, control signal ACTIVE at lead 410 returns to a low level at time $t_4$ indicating the end of the critical circuit operation. The low level of control signal ACTIVE resets the latch circuit of FIG. 4. Thus, power fail signal PFAIL at lead 104 returns to a low level, and complementary power fail signal/PFAIL at lead 106 returns to a high level.

The present power supply protection circuit is highly advantageous for several reasons. First, it maintains a relatively constant power supply voltage for specific circuits during critical operations even when an external power supply voltage may fail. Second, it consumes no additional power during normal circuit operation except to initially charge capacitors $C_S$, $C_R$, and $C_P$. Third, load current is supplied at the rate required by load circuit 160, so that load power supply voltage VDDL remains constant even with varying load current.

Referring now to FIG. 3, there is an alternative embodiment of the power supply protection circuit of FIG. 2. In this embodiment, boost capacitor $C_B$ 300 is added to the power supply protection circuit of FIG. 2 as shown. Recall from the discussion of FIG. 5 that load power supply voltage VDDL degraded until a power failure was detected and power fail signal PFAIL* was produced. After this, load power supply voltage VDDL remained substantially equal to the voltage on capacitor $C_S$. According to the embodiment of FIG. 3, boost capacitor $C_B$ couples voltage to capacitor $C_S$ in response to the rising edge of power fail signal PFAIL. Thus, the voltage on capacitor $C_S$ is approximately equal to the original value of load power supply voltage VDDL rather than the degraded value at time $t_3$. Responsively, the power supply protection circuit of FIG. 2 with the modification of FIG. 3 restores and maintains load power supply voltage VDDL at the original value at time $t_0$ rather than the degraded value at time $t_3$.

Referring now to FIG. 6, there is a table of normalized values for $C_P$ and $C_R$ in relation to $C_L$. Here, for the purpose of discussion it is assumed that load circuit 160 comprises load capacitor $C_L$ and that no load current is consumed. This assumption is useful to determine the charge or voltage coupled to load capacitor $C_L$ for various values of reservoir capacitor $C_R$ 142 and pump capacitor $C_P$ 144. The table of FIG. 6 includes three columns and twenty rows. The first column is a ratio of $C_R/C_L$ and varies from 0.1 to 2.0. The second column is a ratio of $C_P/C_R$ and corresponds to the values of $C_R/C_L$ in the first column. The third column dV shows normalized values of the voltage coupled to capacitor $C_L$ for the values of $C_R$ and $C_P$ in the same row. For example, if $C_R$ is charged to 1.0 V, for $C_R/C_L=1.0$ and $C_P/C_R=1.4$, 0.389 V is coupled to capacitor $C_L$. In general, as the ratio of $C_R/C_L$ increases, dV may increase. However, this also depends on the value pump capacitor $C_P$. The ratio of $C_P/C_R$ in the second column is selected to minimize the value of total capacitance divided by dV (($C_R+C_P+C_L$)/dV). In other words, in the previous the ratio of total capacitance to dV is 8.743e-10 for $C_L$=1e-10. If the ratio $C_P/C_R$ is reduced to 1.3, the ratio of total capacitance to dV increases to 8.758e-10. Correspondingly, if the ratio $C_P/C_R$ is increased to 1.5, the ratio of total capacitance to dV increases to 8.750e-10. Thus, the second column is the ratio of $C_P/C_R$ that produces a local minimum of the ratio of total capacitance to dV.

The present invention advantageously reduces the need for a decoupling capacitor in parallel with load circuit 160. For example, if the capacitance of load circuit 160 is taken as $C_L$ and the ratio of $C_R/C_L$ is taken as 1.0, then $C_P/C_R$ may be 1.4. In this example, $C_R=C_L$ and $C_P=1.4\,C_L$. When a power supply failure is detected, reservoir capacitor $C_R$ pumps all available charge to load circuit 160. Power supply voltage VDDL then degrades to 90% of the supply voltage prior to failure at time T. In order to simply attain 90% of the initial supply voltage prior to failure at time T a decoupling capacitor in parallel with load circuit 160 must be $6.44\,C_L$. By way of comparison, the 90% supply voltage at time T is achieved with only $2.4\,C_L$ ($C_P+C_R$) with the present invention. Thus, the value of $C_P+C_R$ is only 37% of the size of a decoupling capacitor ($6.44\,C_L$) that would be added in parallel with load circuit 160 to achieve the 90% value at time T.

Still further, while numerous examples have thus been provided, one skilled in the art should recognize that various modifications, substitutions, or alterations may be made to the described embodiments while still falling with the inventive scope as defined by the following claims. Embodiments of the present invention may be applied to virtually any circuit to temporarily maintain a functional power supply voltage should an unexpected power supply failure occur during a critical circuit operation. Other combinations will be readily apparent to one of ordinary skill in the art having access to the instant specification.

What is claimed is:

1. A circuit, comprising:
   a first capacitor arranged to store a power supply sample voltage in response to a first power fail signal;
   a second capacitor arranged to provide a charge reservoir;
   a third capacitor having first and second terminals;
   a first transistor having a control terminal and a current path, and having a first terminal of the current path coupled to the second capacitor and a second terminal of the current path coupled to the first terminal of the third capacitor;
   a second transistor having a control terminal coupled to receive the first power fail signal and having a current path coupled between a power supply voltage terminal and the first capacitor;
   a third transistor having a control terminal coupled to receive the first power fail signal and having a current path coupled between the power supply voltage terminal and the first terminal of the first transistor; and
   a comparator circuit having a first input terminal coupled to the first capacitor and a second input terminal coupled to the second terminal of the third capacitor, and having an output terminal coupled to the control terminal of the first transistor.

2. A circuit as in claim 1, comprising:
   a latch circuit coupled to receive a second power fail signal and an active signal having a first logic state indicating an active cycle, the latch circuit arranged to latch the second power fail signal, thereby producing the first power fail signal while the active signal maintains the first logic state.

3. A circuit as in claim 1, comprising:
   a fourth transistor having a control terminal coupled to receive the first power fail signal and having a current path coupled between a power supply voltage terminal and the comparator circuit; and
   a fifth transistor having a control terminal coupled to receive the first power fail signal and having a current path coupled between the power supply voltage terminal and the output terminal of the comparator circuit.

4. A circuit as in claim 1, comprising:
   a sixth transistor having a control terminal and having a current path coupled between the first terminal of the third capacitor and a reference voltage terminal.

5. A circuit as in claim 1, wherein the first transistor conducts charge from the second capacitor to the third capacitor in response to a signal at the output terminal of the comparator circuit.

6. A circuit as in claim 1, wherein the second terminal of the third capacitor is coupled to a load power supply terminal.

7. A circuit as in claim 6, wherein the load power supply terminal is a power supply terminal of a nonvolatile memory circuit.

8. A circuit as in claim 6, wherein the load power supply terminal is a power supply terminal of a processor circuit.

9. A method of operating a power supply, comprising:
   storing charge in a charge reservoir capacitor;
   connecting a sample capacitor to a power supply terminal;
   detecting a power supply failure;
   disconnecting the sample capacitor from the power supply terminal, thereby storing a power supply sample voltage on the sample capacitor in response to the step of detecting;
   receiving a load power supply voltage;
   comparing the power supply sample voltage to the load power supply voltage after the step of disconnecting; and
   adding charge from the charge reservoir capacitor to the load power supply in response to the step of comparing.

10. A method as in claim 9, comprising:
    receiving a power fail signal in response to the step of detecting;
    receiving an active signal having a first logic state indicating an active cycle; and
    initiating the step of comparing in response to the power fail signal and the first logic state of the active signal.

11. A method as in claim 10, comprising latching the power fail signal in response to the first logic state of the active signal.

12. A method as in claim 9, wherein the step of adding charge maintains the load power supply voltage at a substantially constant voltage.

13. A method as in claim 9, wherein the active cycle is an active cycle of a nonvolatile memory circuit.

14. A method as in claim 9, wherein the active cycle is an active cycle of a processor circuit.

15. A method as in claim 9, comprising boosting the power supply sample voltage after the step of detecting.

16. A method, comprising:
    providing current flow to a sample capacitor from a power supply;
    discontinuing current flow to the sample capacitor from the power supply after the step of providing, thereby storing a sample voltage on the sample capacitor;
    storing charge in a charge reservoir capacitor;
    detecting a power supply voltage failure;
    comparing the sample voltage to a load power supply voltage after the step of detecting; and
    adding charge from the charge reservoir capacitor to the load power supply in response to the step of comparing.

17. A method as in claim 16, wherein the step of adding charge maintains the load power supply voltage at a value greater than the power supply voltage.

18. A method as in claim 16, wherein the step of detecting occurs during an active cycle of a nonvolatile memory circuit.

19. A method as in claim 16, comprising boosting the sample voltage after the step of detecting.

\* \* \* \* \*